(12) United States Patent
Saito et al.

(10) Patent No.: US 11,523,045 B2
(45) Date of Patent: Dec. 6, 2022

(54) IMAGE SENSOR, IMAGE CAPTURING APPARATUS, METHOD OF PERFORMING PHASE DIFFERENCE FOCUS DETECTION, AND STORAGE MEDIUM

(71) Applicant: CANON KABUSHIKI KAISHA, Tokyo (JP)

(72) Inventors: Makiko Saito, Tokyo (JP); Nobuhiro Takeda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 15 days.

(21) Appl. No.: 17/351,511

(22) Filed: Jun. 18, 2021

(65) Prior Publication Data

US 2021/0400203 A1 Dec. 23, 2021

(30) Foreign Application Priority Data

Jun. 22, 2020 (JP) .............................. JP2020-107231

(51) Int. Cl.
  *H04N 5/232* (2006.01)
  *H04N 9/04* (2006.01)

(52) U.S. Cl.
  CPC ... *H04N 5/232122* (2018.08); *H04N 9/04557* (2018.08)

(58) Field of Classification Search
  CPC .................... H04N 5/232122; H04N 5/36961
  See application file for complete search history.

(56) References Cited

U.S. PATENT DOCUMENTS 9,794,468 B2 * 10/2017 Fukuda ............. H01L 27/14601
2016/0156867 A1 * 6/2016 Fukuda ............. H01L 27/14601
                                                    348/302

FOREIGN PATENT DOCUMENTS

JP 2016-111678 A 6/2016

* cited by examiner

*Primary Examiner* — Cynthia Segura
(74) *Attorney, Agent, or Firm* — Cowan, Liebowitz & Latman, P.C.

(57) ABSTRACT

An image sensor comprises: a plurality of microlenses; and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations.

16 Claims, 8 Drawing Sheets

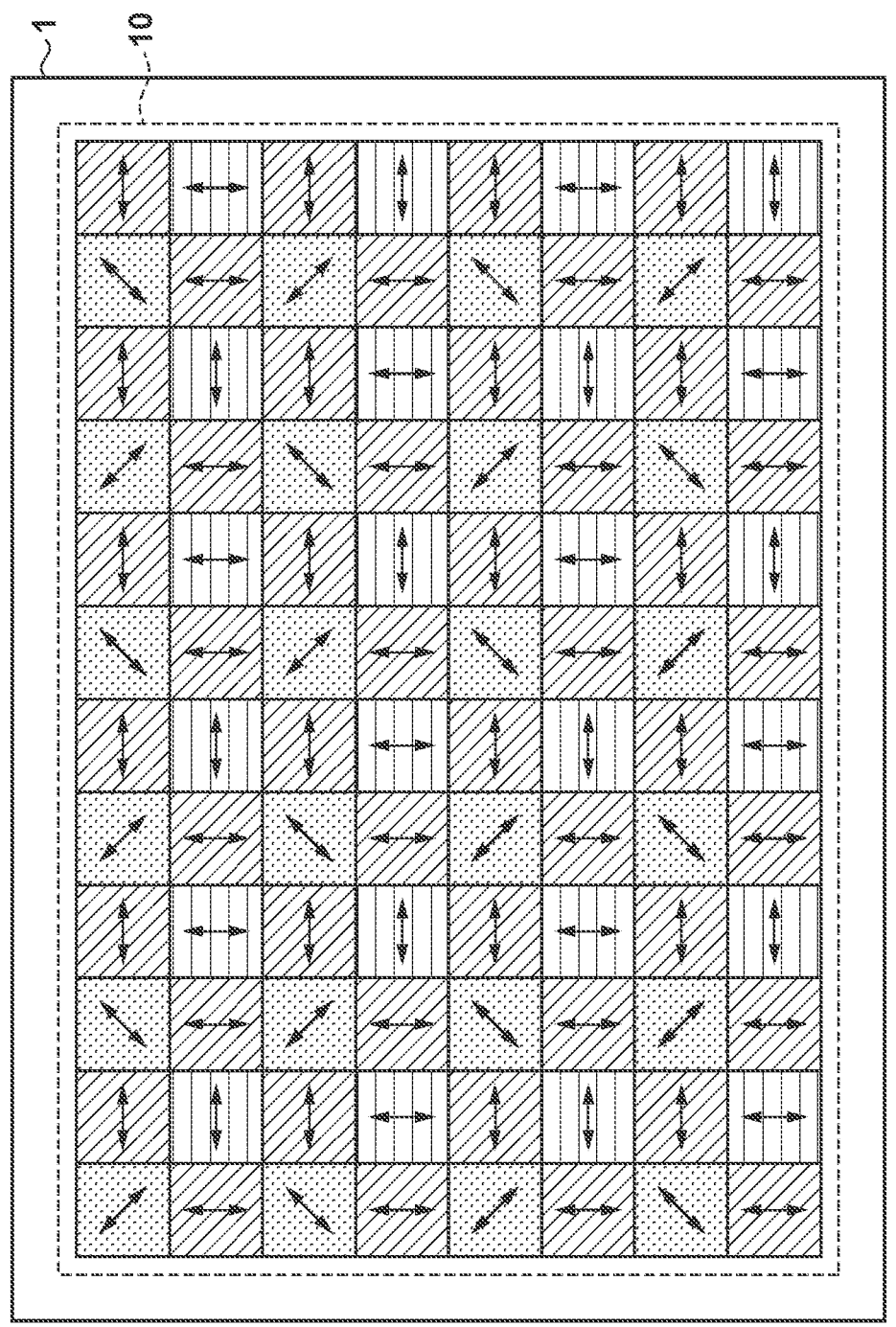
FIG. 5
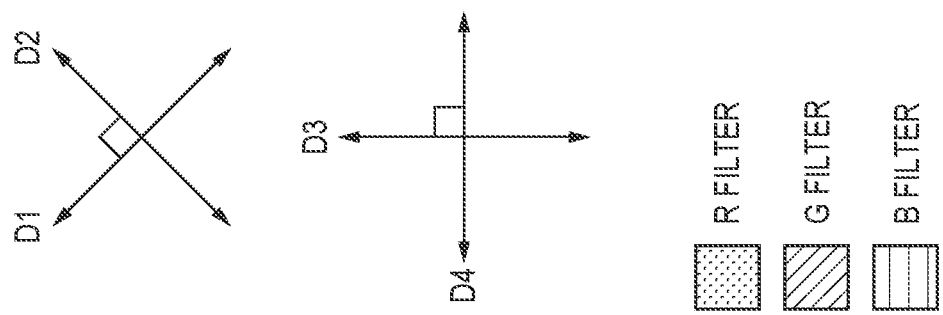

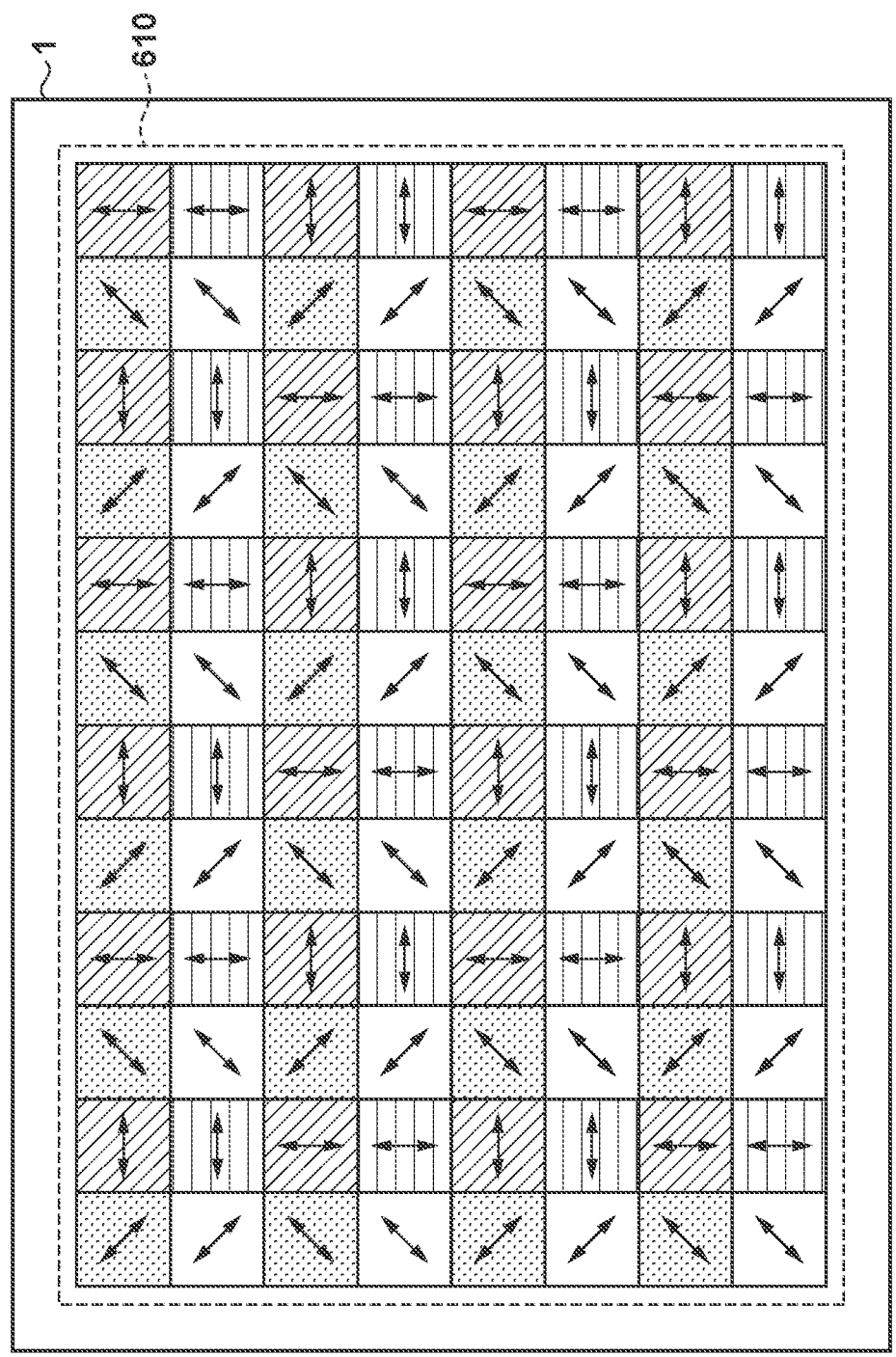
FIG. 6
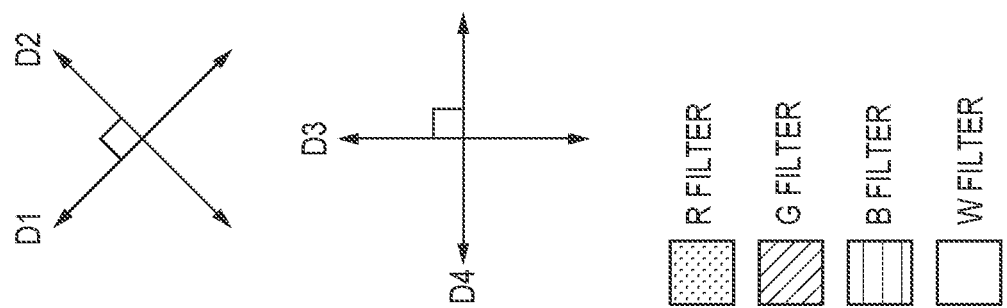

IMAGE SENSOR, IMAGE CAPTURING APPARATUS, METHOD OF PERFORMING PHASE DIFFERENCE FOCUS DETECTION, AND STORAGE MEDIUM

BACKGROUND OF THE INVENTION

Field of the Invention

The preset invention relates to an image sensor, an image capturing apparatus, method of performing phase difference focus detection, and a storage medium.

Description of the Related Art

As one of the focus detection methods of an image capturing apparatus, a so-called on-imaging plane phase difference method is known in which pupil division signals are acquired using focus detection pixels formed in an image sensor and focus detection is performed by a phase difference method using the pupil division signals. As a focus detection pixel, a configuration in which one microlens and a plurality of sensitivity regions are formed is known, and the pupil division signals can be acquired by the plurality of sensitivity regions respectively receiving light that has passed through different pupil regions of an imaging optical system.

Japanese Patent Laid-Open No. 2016-111678 discloses an image sensor in which a plurality of photoelectric conversion regions are arranged in two directions and that acquires pupil division signals with two pupil division directions.

Generally, in the phase difference focus detection, there is a problem that the accuracy of the focus detection deteriorates when the brightness pattern of the subject, that is, the direction in which the brightness changes, is close to the division direction of the pupil division signals.

If an image sensor is configured in which the pixels described in Japanese Patent Laid-Open No. 2016-111678 are reconfigured so as to divide the pupil division signals in a total of four directions, namely, vertical, horizontal, and two diagonal directions, the characteristics are different between the pixels having different division directions and the image signals obtained by adding the pupil division signals for each pixel will vary.

SUMMARY OF THE INVENTION

The present invention has been made in consideration of the above situation, and enables an increase in the number of division directions of pupil regions while suppressing the variation in sensitivities of image signals.

According to the present invention, provided is an image sensor comprising: a plurality of microlenses; and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations.

Further, according to the present invention, provided is an image capturing apparatus comprising: an image sensor comprising: a plurality of microlenses; and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, and a focus detection unit that obtains pupil division signals corresponding to light fluxes passing through different pupil regions, respectively, from signals output from the pixel region and performs phase difference focus detection for each of structures formed by connecting the plurality of first regions and the plurality of second regions by the plurality of connection portions in the different combinations based on the pupil division signals, wherein the focus detection unit is implemented by one or more processors, circuitry or a combination thereof.

Furthermore, according to the present invention, provided is an image capturing apparatus comprising: an image sensor comprising: a plurality of microlenses; and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, and a focus detection unit that obtains pupil division signals which divide pupil region from signals output from the pixel region and performs phase difference focus detection based on the pupil division signals, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement, wherein the focus detection unit generates luminance signals which divide pupil regions based on the pupil division signals obtained from the first to fourth structures, and performs the phase difference focus detection based on the luminance signals, and wherein the focus detection unit is implemented by one or more processors, circuitry or a combination thereof.

Further, according to the present invention, provided is an image capturing apparatus comprising: an image sensor comprising: a plurality of microlenses; and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, and a focus detection unit that obtains pupil division signals which divide pupil region from signals output from the pixel region and performs phase difference focus detection based on the pupil division signals, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, wherein the focus detection unit generates luminance signals whose pupils are divided based on the pupil division signals obtained from the first to sixth structures, and performs the phase difference focus detection based on the luminance signals, and wherein the focus detection unit is implemented by one or more processors, circuitry or a combination thereof.

Further, according to the present invention, provided is a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement, the method comprising: generating luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the first coefficient larger than the second and third coefficients, the luminance signals corresponding to light fluxes passing through pupil regions divided in second direction are generated by using the pupil division signals obtained from the second structures and setting the first coefficient larger than the second and third coefficients, the luminance signals corresponding to light fluxes passing through pupil regions divided in third direction are generated by using the pupil division signals obtained from the first structures and setting the first coefficient smaller than the second and third coefficients, the luminance signals corresponding to light fluxes passing through pupil regions divided in fourth direction are generated by using the pupil division signals obtained from the second structures and setting the first coefficient smaller than the second and third coefficients, wherein the focus detection is performed for each of the first to fourth directions, and wherein the first to fourth directions are different from each other.

Further, according to the present invention, provided is a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, the method comprising: generating the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, multiplying the pupil division signals obtained from the fifth and sixth structures by a fourth coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the fourth coefficient smaller than the first coefficient and larger than the second and third coefficients, the luminance signals corresponding to light fluxes passing through pupil regions divided in second direction are generated by using the pupil division signals obtained from the second structures and setting the fourth coefficient smaller than the first coefficient and larger than the second and third coefficients, the luminance signals corresponding to light fluxes passing through pupil regions divided in third direction are generated by using the pupil division signals obtained from the first structures and setting the fourth coefficient larger than the first coefficient and the first coefficient smaller than the second and third coefficients, the luminance signals corresponding to light fluxes passing through pupil regions divided in fourth direction are generated by using the pupil division signals obtained from the second structures and setting the fourth coefficient larger than the first coefficient and the first coefficient smaller than the second and third coefficients, wherein the focus detection is performed for each of the first to fourth directions, and wherein the first to fourth directions are different from each other.

Further, according to the present invention, provided is a non-transitory computer-readable storage medium, the storage medium storing a program that is executable by the computer, wherein the program includes program code for causing the computer to function as a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement, the method comprising: generating luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, and adding products, and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the first coefficient larger than the second and third coefficients, the luminance signals corresponding to light fluxes passing through pupil regions divided in second direction are generated by using the pupil division signals obtained from the second structures and setting the first coefficient larger than the second and third coefficients, the luminance signals corresponding to light fluxes passing through pupil regions divided in third direction are generated by using the pupil division signals obtained from the first structures and setting the first coefficient smaller than the second and third coefficients, the luminance signals corresponding to light fluxes passing through pupil regions divided in fourth direction are generated by using the pupil division signals obtained from the second structures and setting the first coefficient smaller than the second and third coefficients, wherein the focus detection is performed for each of the first to fourth directions, and wherein the first to fourth directions are different from each other.

Further, according to the present invention, provided is a non-transitory computer-readable storage medium, the storage medium storing a program that is executable by the computer, wherein the program includes program code for causing the computer to function as a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, the method comprising: generating the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, multiplying the pupil division signals obtained from the fifth and sixth structures by a fourth coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the fourth coefficient smaller than the first coefficient and larger than the second and third coefficients, the luminance signals corresponding to light fluxes passing through pupil regions divided in second direction are generated by using the pupil division signals obtained from the second structures and setting the fourth coefficient smaller than the first coefficient and larger than the second and third coefficients, the luminance signals corresponding to light fluxes passing through pupil regions divided in third direction are generated by using the pupil division signals obtained from the first structures and setting the fourth coefficient larger than the first coefficient and the first coefficient smaller than the second and third coefficients, the luminance signals corresponding to light fluxes passing through pupil regions divided in fourth direction are generated by using the pupil division signals obtained from the second structures and setting the fourth coefficient larger than the first coefficient and the first coefficient smaller than the second and third coefficients, wherein the focus detection is performed for each of the first to fourth directions, and wherein the first to fourth directions are different from each other.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 5 is a schematic view showing a color filter arrangement in a pixel region and division directions of pupil division signals according to a first embodiment.

FIG. 6 is a schematic view showing a color filter arrangement in a pixel region and division directions of pupil division signals according to a second embodiment.

DESCRIPTION OF THE EMBODIMENTS

Figure 1:
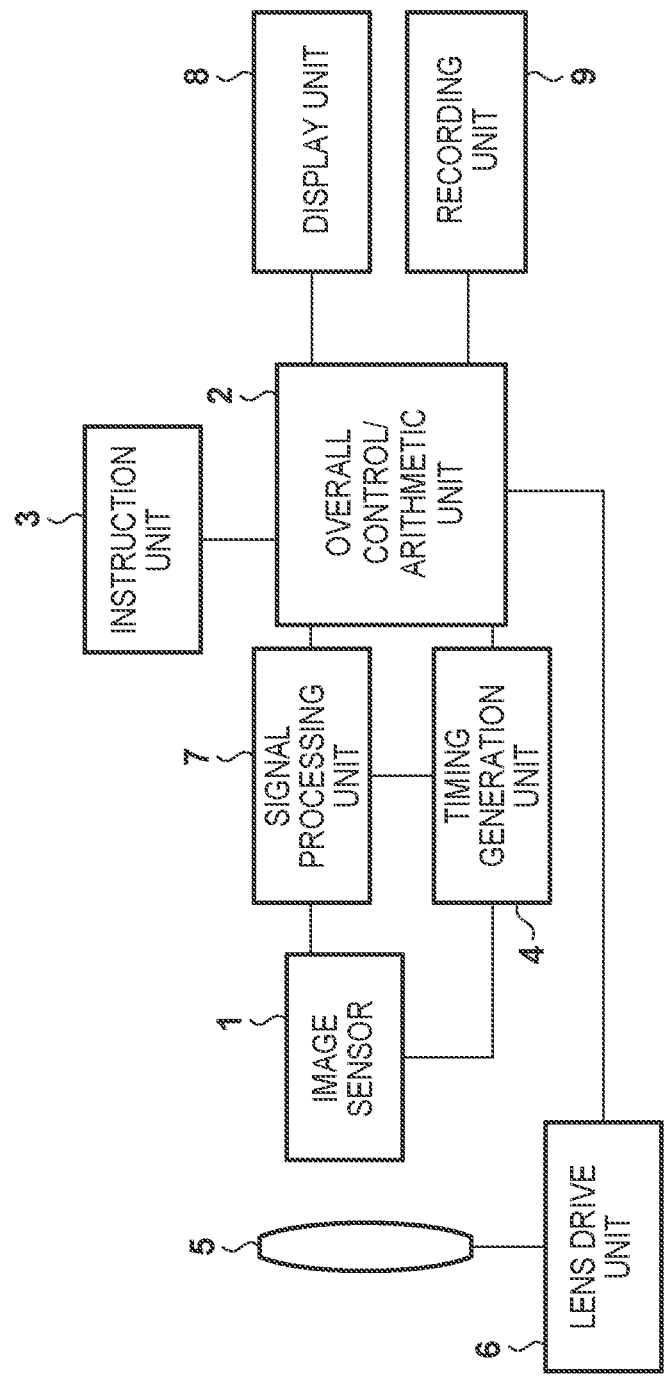
FIG. 1 is a block diagram showing a schematic configuration of an image capturing apparatus according to an embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

FIG. 1 is a block diagram showing a schematic configuration of an image capturing apparatus according to an embodiment of the present invention. The image capturing apparatus of the present embodiment includes an image sensor 1, an overall control/arithmetic unit 2, an instruction unit 3, a timing generation unit 4, an imaging lens unit 5, a lens drive unit 6, a signal processing unit 7, a display unit 8 and a recording unit 9.

The imaging lens unit 5 forms an optical image of a subject on the image sensor 1. Although it is represented by one lens in the figure, the imaging lens unit 5 may include a plurality of lenses including a focus lens, a zoom lens, and a diaphragm, and may be detachable from the main body of the image capturing apparatus or may be integrally configured with the main body.

The image sensor 1 includes a pixel portion in which a plurality of pixels each having a plurality of photoelectric conversion portions are two-dimensionally arranged, and converts the light incident through the imaging lens unit 5 into an electric signal and outputs it. The detailed configuration of the image sensor 1 will be described later, but briefly, signals are read out from each pixel so that pupil division signals, corresponding to light fluxes passed through different pupil regions of the imaging lens unit 5, that can be used in phase difference focus detection and an image signal that is a signal of each pixel can be acquired.

The signal processing unit 7 performs predetermined signal processing such as correction processing on the signals output from the image sensor 1, and outputs the pupil division signals used for focus detection and the image signal used for recording.

The overall control/arithmetic unit 2 comprehensively drives and controls the entire image capturing apparatus. In addition, the overall control/arithmetic unit 2 also performs calculations for focus detection using the pupil division signals processed by signal processing unit 7, performs arithmetic processing for exposure control, predetermined signal processing, such as development for generating images for recording/playback and compression, on the image signal.

The lens drive unit 6 drives the imaging lens unit 5, and performs focus control, zoom control, aperture control, and the like on the imaging lens unit 5 according to control signals from the overall control/arithmetic unit 2.

The instruction unit 3 accepts inputs such as shooting execution instructions, drive mode settings for the image capturing apparatus, and other various settings and selections that are input from the outside by the operation of the user, for example, and sends them to the overall control/arithmetic unit 2.

The timing generation unit 4 generates a timing signal for driving the image sensor 1 and the signal processing unit 7 according to a control signal from the overall control/arithmetic unit 2.

The display unit 8 displays information such as a preview image, a playback image, and the drive mode settings of the image capturing apparatus.

The recording unit 9 is provided with a recording medium (not shown), and an image signal for recording is recorded. Examples of the recording medium include semiconductor memories such as flash memory. The recording medium may be detachable from the recording unit 9 or may be built-in.

Next, the pixel configuration in this embodiment will be described with reference to FIGS. 2 to 4.

Figure 2:
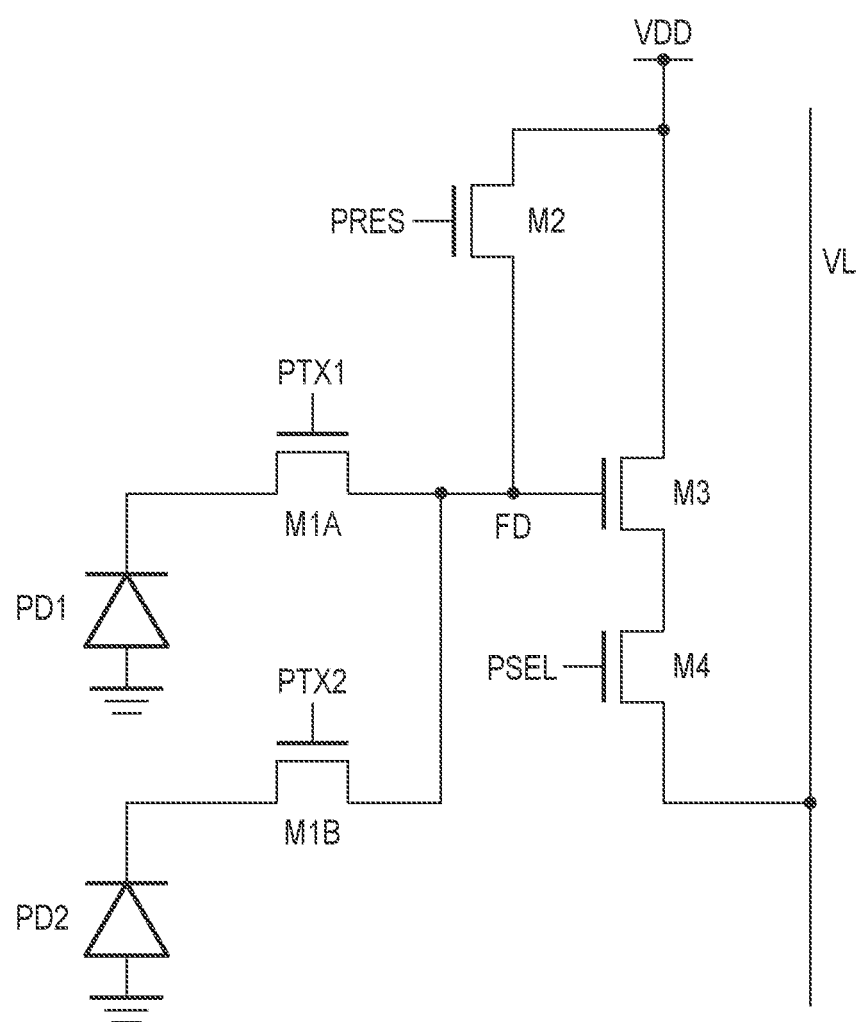
FIG. 2 is an equivalent circuit diagram of a pixel according to the embodiment.

FIG. 2 is an equivalent circuit diagram of a pixel in the image sensor 1 of the present embodiment. Each pixel in this embodiment has one of the structures of first to fourth pixels P1 to P4 as described later with reference to FIGS. 3A to 3F and FIGS. 4A to 4F, however, the circuit configuration shown in FIG. 2 is common to the first to fourth pixels P1 to P4.

Each pixel has photodiodes PD1 and PD2 that photoelectrically convert incident light, transfer transistors M1A and M1B, a reset transistor M2, a floating diffusion portion FD as a charge holding unit, an amplification transistor M3, and a selection transistor M4. As each transistor, an N-channel MOS transistor can be used. Hereinafter, it will be described assuming that N-channel MOS transistors are used.

A control signal PTX1 is input to the gate of the transfer transistor M1A from a control circuit (not shown) in response to a timing signal from the timing generation unit 4. The transfer transistor M1A is turned on while the control signal PTX1 is High (hereinafter referred to as "H"), and transfers the electric charge accumulated in the photodiode PD1 to the floating diffusion portion FD. Further, a control signal PTX2 is input to the gate of the transfer transistor M1B from the control circuit (not shown), the transfer transistor M1B is turned on while the control signal PTX2 is H and transfers the electric charge accumulated in the photodiode PD2 to the floating diffusion portion FD.

A control signal PRES is input to the gate of the reset transistor M2 from the control circuit (not shown), and the reset transistor M2 is turned ON while the control signal PRES is H, and the electric charge in the floating diffusion portion FD is reset to a power supply voltage VDD. By setting the control signal PRES and the control signals PTX1 and PTX2 to H simultaneously, it is possible to reset the photodiodes PD1 and PD2 to the power supply voltage VDD.

A control signal PSEL is input to the gate of the selection transistor M4 from the control circuit (not shown). When the selection transistor M4 is turned ON while the control signal PSEL is H, a signal voltage converted from the amount of electric charge held in the floating diffusion portion FD by the amplification transistor M3 is output to the signal line VL.

In the pixel of the present embodiment having the above circuit configuration, by turning on the transfer transistor M1A independently, the electric charge of the photodiode PD1 can be transferred to the floating diffusion portion FD and read out. Hereinafter, the signal read out from the photodiode PD1 is referred to as an A signal. Further, by turning on the transfer transistor M1B independently, the electric charge of the photodiode PD2 can be transferred to the floating diffusion portion FD and read out. Hereinafter, the signal read out from the photodiode PD2 is referred to as a B signal. The A signal and the B signal are pupil division signals, and an image signal (A+B signal) can be obtained by adding the A signal and the B signal for each pixel in the signal processing unit 7.

Alternatively, after reading out the A signal, the transfer transistors M1A and M1B may be turned on at the same time to transfer the charges of the photodiodes PD1 and PD2 to the floating diffusion portion FD and the transferred charge may be read out, whereby the A+B signal can be obtained. This A+B signal is an image signal, and by subtracting the A signal from the A+B signal in the signal processing unit 7 to obtain the B signal, pupil division signals that can be used for focus detection can be obtained.

Figure 3A:
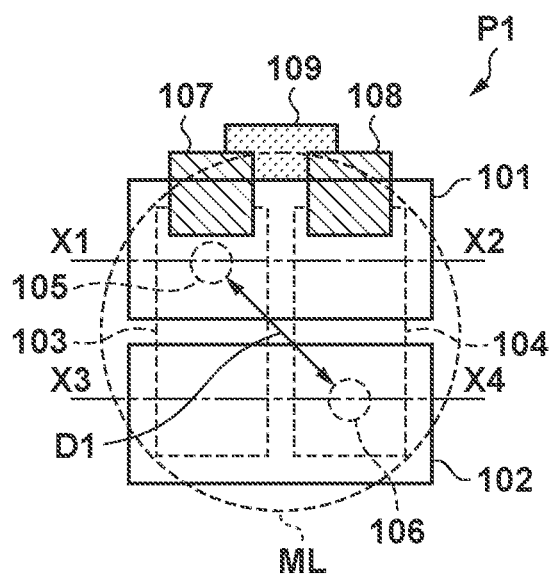
FIGS. 3A to 3F are plan views and cross-sectional views showing configurations of first and second pixels according to the embodiment.
Figure 3B:
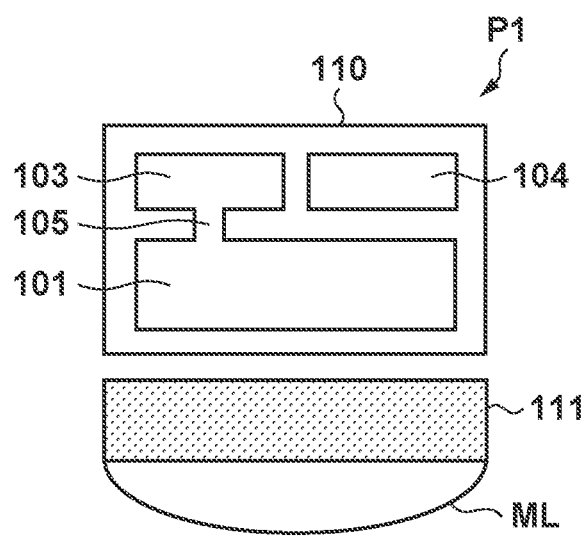
Figure 3C:
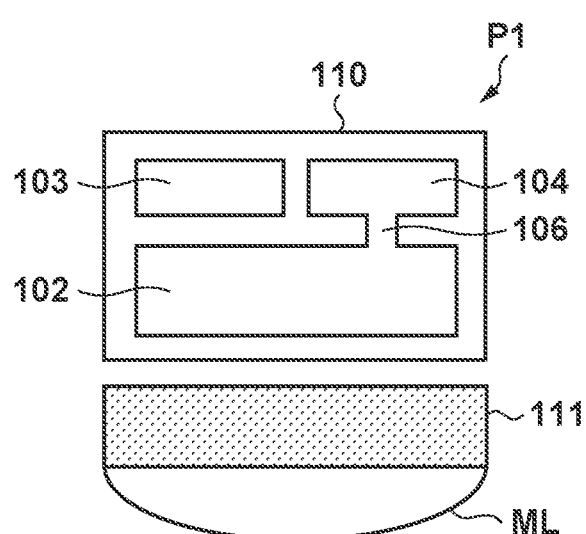
Figure 3D:
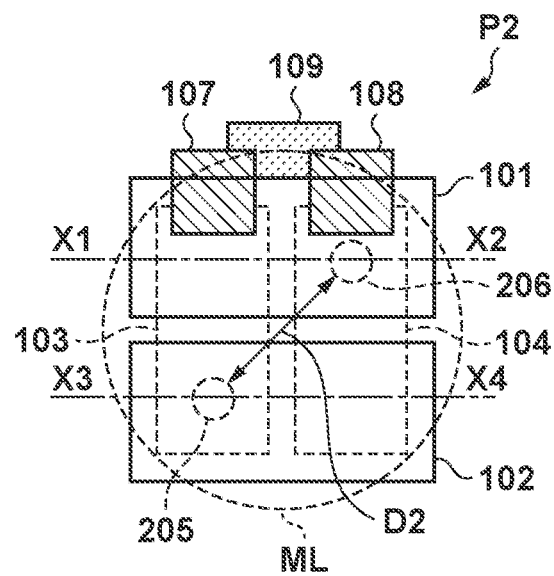
Figure 3E:
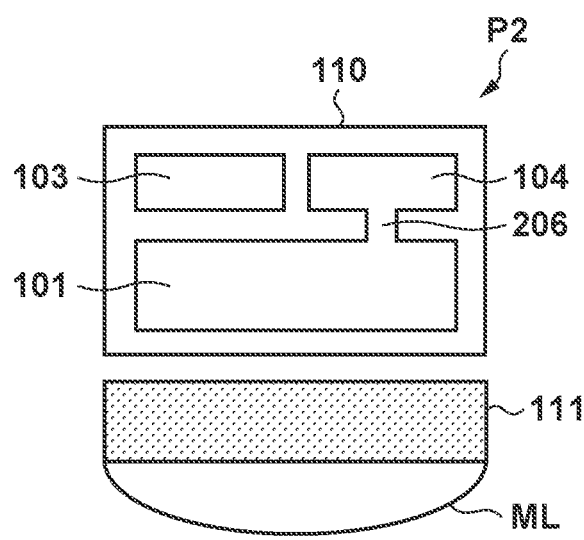
Figure 3F:
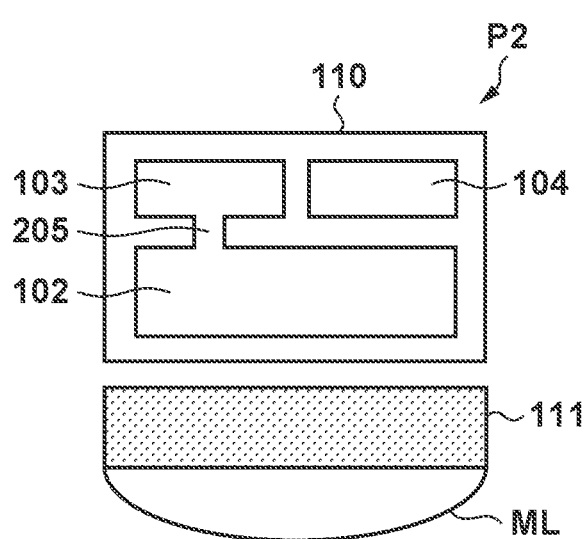
Figure 4A:
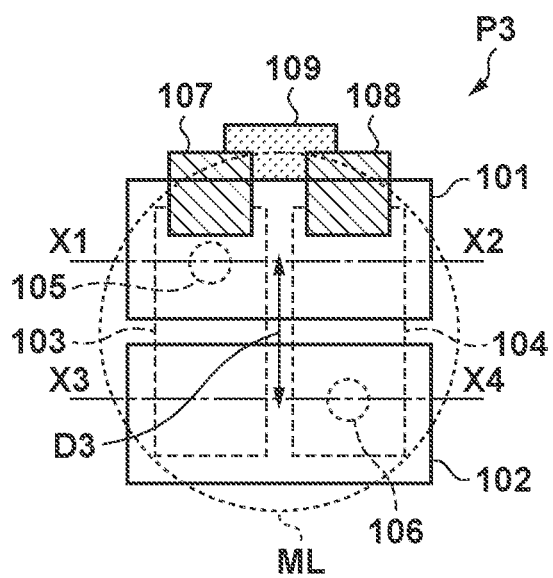
FIGS. 4A to 4F are plan views and cross-sectional views showing configurations of third and fourth pixels according to the embodiment.
Figure 4B:
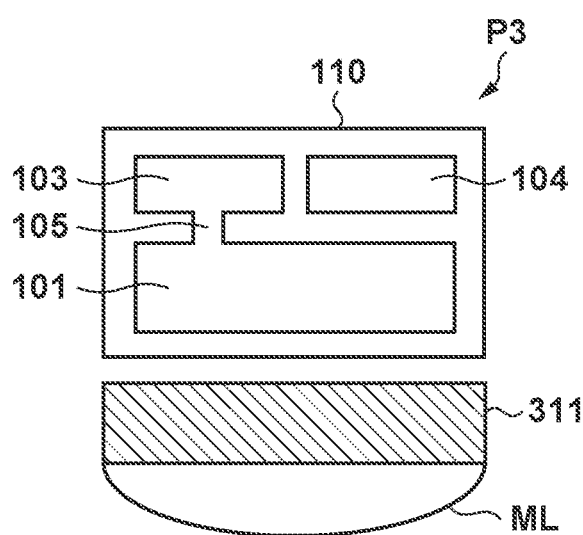
Figure 4C:
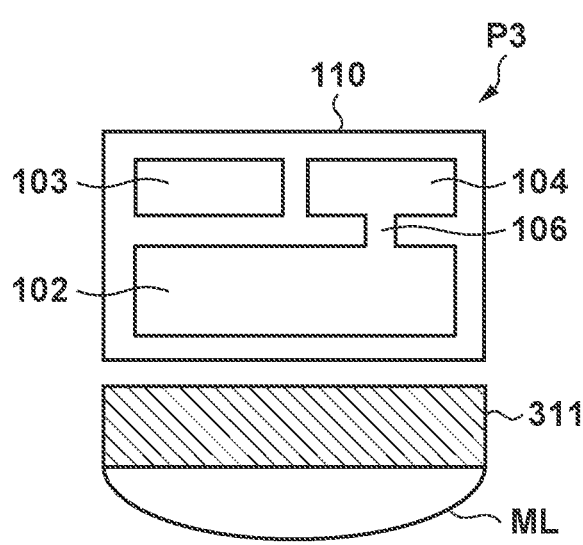
Figure 4D:
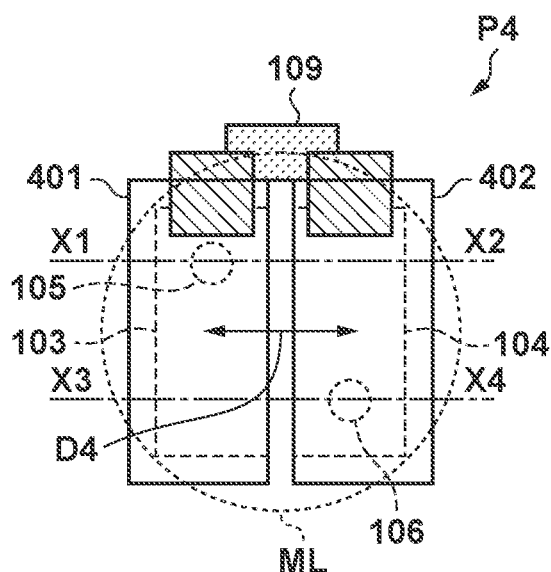
Figure 4E:
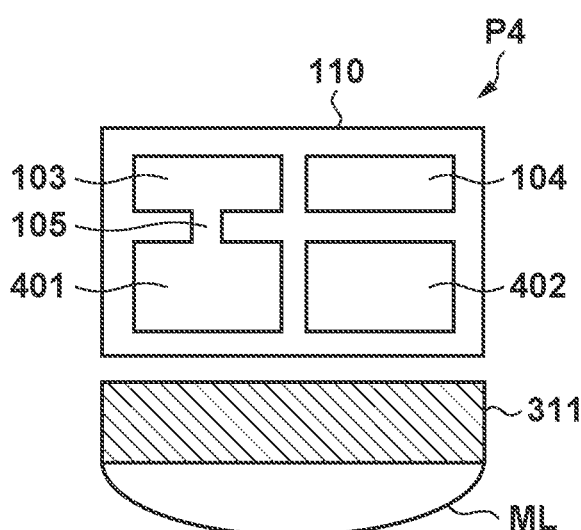
Figure 4F:
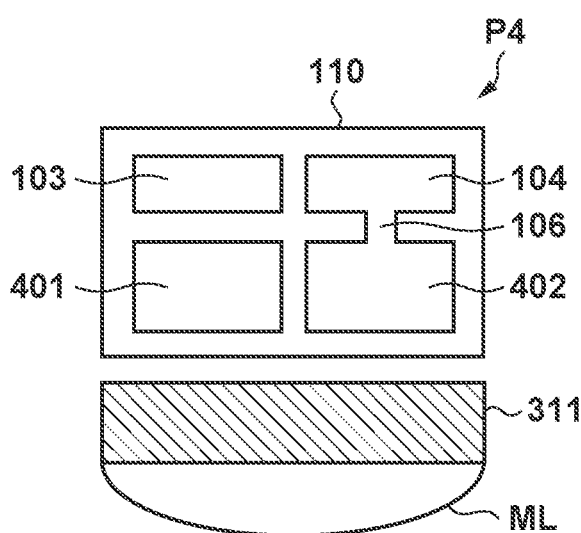

FIGS. 3A to 3F and FIGS. 4A to 4F are plan views and cross-sectional views showing schematic configurations of pixels having the circuit configuration shown in FIG. 2 in the present embodiment. In the present embodiment, pixels having four different structures are used, and among the four types of pixels, FIGS. 3A to 3C show the structure of the first pixel P1, FIGS. 3D to 3F show the structure of the second pixel P2, FIGS. 4A to 4C shows the structure of the third pixel P3, and FIGS. 4D to 4F show the structure of the fourth pixel P4.

FIG. 3A is the schematic plan view of the first pixel P1. In FIG. 3A, a microlens ML guides incident light to the photodiodes PD1 and PD2. Sensitivity regions 101, 102, 103, and 104 are of the photodiodes PD1 and PD2.

The pupil of the imaging lens unit 5 and the sensitivity regions 101, 102, 103, 104 have a conjugate relationship with respect to the microlens ML, and the sensitivity regions 101, 102, 103, 104 respectively receive light that has passed through different regions of the pupil of the imaging lens unit 5. Further, the sensitivity regions 101 and 102, and the sensitivity regions 103 and 104 are arranged so as to have an optically conjugate relationship with respect to the microlens ML. Further, the sensitivity regions 101 and 102 are arranged so as to divide the pupil of the imaging lens unit 5 in the vertical direction in the drawing, and the sensitivity regions 103 and 104 are arranged so as to divide the pupil of the imaging lens unit 5 in the horizontal direction, which is different from the division direction of the sensitivity regions 101 and 102 by 90°.

A connecting portion 105 electrically connects the sensitivity regions 101 and 103, and a connecting portion 106 electrically connects the sensitivity regions 102 and 104. In the first pixel P1, the sensitivity regions 101 and 103 and the connection portion 105 form the sensitivity region of the photodiode PD1, and the sensitivity regions 102 and 104 and the connecting portion 106 form the sensitivity region of the photodiode PD2.

Reference numeral 107 denotes a gate electrode of the transfer transistor M1A, and reference numeral 108 denotes a gate electrode of the transfer transistor M1B. Reference numeral 109 denotes a semiconductor region constituting the floating diffusion portion FD.

A schematic view of the X1-X2 cross section of the first pixel P1 shown in FIG. 3A is shown in FIG. 3B, and a schematic view of the X3-X4 cross section is shown in FIG. 3C. In FIG. 3B and FIG. 3C, it is assumed that light is incident from the lower side of the drawing (microlens ML side), and the depth in the following description indicates the depth from the incident surface toward the upper side of the drawing. Sensitivity regions 101 and 102 are provided at the first depth in a semiconductor substrate 110. Further, sensitivity regions 103 and 104 are provided at a second depth in the semiconductor substrate 110, which is deeper than the first depth. The connecting portion 105 is provided between the sensitivity regions 101 and 103, and electrically connects the sensitivity regions 101 and 103. Further, the connecting portion 106 is provided between the sensitivity regions 102 and 104, and electrically connects the sensitivity regions 102 and 104.

A color filter 111 is configured between the microlens ML and the semiconductor substrate 110. In the present embodiment, the first pixel P1 is provided with an R filter, as the color filter 111, that transmits red light.

FIG. 3D is a schematic plan view of the second pixel P2. Further, a schematic view of the X1-X2 cross section of the second pixel P2 shown in FIG. 3D is shown in FIG. 3E, and a schematic view of the X3-X4 cross section is shown in FIG. 3F. Similar to FIGS. 3B and 3C, in FIGS. 3E and 3F, it is assumed that light is incident from the lower side of the drawing (microlens ML side), and the depth in the following description indicates the depth from the incident surface toward the upper side of the drawing.

The second pixel P2 has different connection portions 205 and 206 from the first pixel P1, but other configurations and arrangements are the same as those of the first pixel P1.

In the second pixel P2, the connecting portion 205 electrically connects the sensitivity regions 102 and 103, and the connecting portion 206 electrically connects the sensitivity regions 101 and 104. Therefore, in the second pixel P2, the sensitivity regions 102 and 103 and the connection portion 205 form the sensitivity region of the photodiode PD1, and the sensitivity regions 101 and 104 and the connection portion 206 form the sensitivity region of the photodiode PD2.

Further, in the present embodiment, the second pixel P2 is provided with an R filter, as the color filter 111, that transmits red light, similarly to the first pixel P1.

Here, the relationship between the depths at which the sensitivity regions 101, 102, 103, and 104 are formed in the first pixel P1 and the second pixel P2 and the wavelength of light that will be photoelectrically converted in each sensitivity region will be described.

In silicon, which is widely used in an image sensor for visible light, incident light is absorbed at the depth closer to the surface of silicon as the wavelength is shorter, and penetrates deeper as the wavelength is longer. For example, the depth at which half of the incident light is absorbed is about 3.2 µm at a wavelength of 700 nm contained in red light, about 0.8 µm at a wavelength of 530 nm contained in green light, and about 0.3 µm at a wavelength of 450 nm contained in blue light.

When the red light transmitted through the R filter 111 is incident on the silicon substrate, a part of the red light is absorbed in the sensitivity regions 101 and 102 at the first depth and is photoelectrically converted. Further, another part is absorbed and photoelectrically converted in the sensitivity regions 103 and 104 at the second depth, whose division direction is 90° different from that of the sensitivity regions 101 and 102.

In the first pixel P1, the electric charges generated in the sensitivity regions 101 and 103 are combined, and the electric charges generated in the sensitivity regions 102 and 104 are combined. Therefore, the division direction of the pupil division signals obtained from the first pixel P1 is a first direction D1 inclined both from the division direction of the sensitivity regions 101 and 102, and the division direction of the sensitivity regions 103 and 104. In this way, in the first pixel P1, the pupil division signals which are pupil-divided in a direction different from the division directions of the sensitivity regions 101 and 102 and the sensitivity regions 103 and 104 are acquired.

Further, in the second pixel P2, the electric charges generated in the sensitivity regions 102 and 103 are combined, and the electric charges generated in the sensitivity regions 101 and 104 are combined. Therefore, the division direction of the pupil division signals obtained from the second pixel P2 is a second direction D2 orthogonal to the first direction D1. In this way, also in the second pixel P2, similarly to the first pixel P1, the pupil division signals which are pupil-divided in a direction different from the division directions of the sensitivity regions 101 and 102 and of the sensitivity regions 103 and 104 are acquired.

Next, the configurations of the third pixel P3 and the fourth pixel P4 will be described.

FIG. 4A is a schematic plan view of the third pixel P3. Further, a schematic view of the X1-X2 cross section of the third pixel P3 shown in FIG. 4A is shown in FIG. 4B, and a schematic view of the X3-X4 cross section is shown in FIG. 4C. Similar to FIGS. 3B and 3C, in FIGS. 4B and 4C, it is assumed that light is incident from the lower side of the drawing (microlens ML side), and the depth in the following description indicates the depth from the incident surface toward the upper side of the drawing.

The third pixel P3 shown in FIGS. 4A to 4C has a different color filter 311 from the first pixel P1, but the other configuration and arrangement are the same as the first pixel P1, and thus the description thereof will be omitted. As the color filter 311 of the third pixel P3, a G filter that transmits green light or a B filter that transmits blue light is provided.

FIG. 4D is a schematic plan view of the fourth pixel P4. Further, a schematic view of the X1-X2 cross section of the fourth pixel P4 shown in FIG. 4D is shown in FIG. 4E, and a schematic view of the X3-X4 cross section is shown in FIG. 4F. Similar to FIGS. 3B and 3C, in FIGS. 4E and 4F, it is assumed that light is incident from the lower side of the drawing (microlens ML side), and the depth in the following description indicates the depth from the incident surface toward the upper side of the drawing.

In the fourth pixel P4, sensitivity regions 401 and 402 are provided at the first depth of the semiconductor substrate 110, and the sensitivity regions 401 and 402 are arranged such that the pupil of the imaging lens unit 5 is divided in the division direction 90° different from the division direction of the sensitivity regions 101 and 102 of the third pixel P3, namely, in the horizontal direction of the drawing. The arrangement of the microlens ML, the sensitivity regions 103 and 104, the gate electrodes 107 and 108 of the transfer transistors, and the floating diffusion portion 109 is the same as that of the third pixel P3.

In the fourth pixel P4, the connecting portion 105 electrically connects the sensitivity regions 401 and 103, and the connecting portion 106 electrically connects the sensitivity regions 402 and 104. Therefore, in the fourth pixel P4, the sensitivity regions 401 and 103 and the connection portion 105 form the sensitivity region of the photodiode PD1, and the sensitivity regions 402 and 104 and the connection portion 106 form the sensitivity region of the photodiode PD2.

With this connection configuration, even if the arrangement of the sensitivity regions at the first depth is different between the third pixel P3 and the fourth pixel P4, the arrangement of the sensitivity regions at the second depth is the same in the third pixel P3 and the fourth pixel P4. Accordingly, the electric charge transfer characteristics of the third pixel P3 and the fourth pixel P4 can be made uniform.

Further, the fourth pixel P4 is provided with a G filter that transmits green light or B filter that transmits blue light, as the color filter 311, similarly to the third pixel P3.

Next, the relationship between the depths at which the sensitivity regions 101, 102, 103, 104, 401 and 402 are formed in the first pixel P1 and the second pixel P2 and the wavelength of light that will be photoelectrically converted in each sensitivity region will be described.

Unlike red light, most of the green light and blue light transmitted through the G filter or B filter are absorbed in the sensitivity regions of the first depth and photoelectrically converted. Therefore, the pupil division signals which are pupil-divided in the substantially same direction as that of the sensitivity regions of the first depth are obtained. Therefore, the division direction of pupil division signals obtained from the third pixel P3 is a third direction D3, which is different from the first direction D1 and the second direction D2. Further, the division direction of the pupil division signals obtained from the fourth pixel P4 is a fourth direction D4 orthogonal to the third direction D3.

First Embodiment

Next, the first embodiment of the present invention will be described. FIG. 5 is a schematic top view of the image sensor 1 according to the first embodiment, and shows an example in which a plurality of first to fourth pixels P1 to P4 having the above configuration are arranged in a matrix.

In FIG. 5, arrows indicate the division directions of the pupil division signals output from the first to fourth pixels P1 to P4 shown in FIGS. 3A to 3F and FIGS. 4A to 4F. That is, arrows rising to the left represent the first direction D1, arrows rising to the right represents the second direction D2, arrows in the vertical direction represents the third direction D3, and arrows in the horizontal direction represents the fourth direction D4. Further, the first pixels P1 and the second pixels P2 having the R filter and the third pixels P3 and the fourth pixels P4 having the G filter or the B filter are arranged so that the arrangement of the color filters is a Bayer arrangement.

By providing the first to fourth pixels P1 to P4 in a pixel region 10, it is possible to acquire pupil division signals in which the pupils are divided in the first to fourth directions D1 to D4.

The overall control/arithmetic unit 2 performs arithmetic processing for focus detection on the pupil division signals obtained from the image sensor 1 and obtains a defocus amount. Since a known method can be used as a method for obtaining the defocus amount from the pupil division signals, it will be briefly described below.

From the first photodiode PD1 and the second photodiode PD2 of each first pixel P1 arranged in the pixel region 10, pupil division signals R1A and R1B corresponding to light fluxes that have passed through pupil regions divided in the first direction D1 of the imaging lens unit 5 are output, respectively. The defocus amount in the first direction D1 can be obtained by performing the correlation calculation while relatively shifting an A image composed by collecting the pupil division signals R1A and a B image composed by collecting the pupil division signals R1B. At this time, information on the reliability of the obtained defocus amount is also acquired.

Further, from the first photodiode PD1 and the second photodiode PD2 of each second pixel P2 arranged in the pixel region 10, pupil division signals R2A and R2B corresponding to light fluxes that have passed through pupil regions divided in the second direction D2 of the imaging lens unit 5 are output, respectively. The defocus amount in the second direction D2 can be obtained by performing the same correlation calculation using an A image composed by collecting the pupil division signals R2A and a B image composed by collecting the pupil division signals R2B. At this time, information on the reliability of the obtained defocus amount is also acquired.

Furthermore, among the third pixels P3 arranged in the pixel region 10, from the first photodiode PD1 and the second photodiode PD2 of each third pixel P3 covered with the G filter, a pair of pupil division signals G3A and G3B corresponding to light fluxes that have passed through pupil regions divided in the third direction D3 of the imaging lens unit 5 are output, respectively. The defocus amount in the third direction D3 can be obtained by performing the same correlation calculation using an A image composed by collecting the pupil division signals G3A and a B image composed by collecting the pupil division signals G3B. At this time, information on the reliability of the obtained defocus amount is also acquired.

Further, among the third pixels P3 arranged in the pixel region 10, from the first photodiode PD1 and the second photodiode PD2 of each third pixel P3 covered with the B filter, a pair of pupil division signals B3A and B3B corresponding to light fluxes that have passed through pupil regions divided in the third direction D3 of the imaging lens unit 5 are output, respectively. The defocus amount in the third direction D3 can be obtained by performing the same correlation calculation using an A image composed by collecting the pupil division signals B3A and a B image composed by collecting the pupil division signals B3B. At this time, information on the reliability of the obtained defocus amount is also acquired.

Further, among the fourth pixels P4 arranged in the pixel region 10, from the first photodiode PD1 and the second photodiode PD2 of each fourth pixel P4 covered with the G filter, a pair of pupil division signals G4A and G4B corresponding to light fluxes that have passed through pupil regions divided in the fourth direction D4 of the imaging lens unit 5 are output, respectively. The defocus amount in the fourth direction D4 can be obtained by performing the same correlation calculation using an A image composed by collecting the pupil division signals G4A and a B image composed by collecting the pupil division signals G4B. At this time, information on the reliability of the obtained defocus amount is also acquired.

Further, among the fourth pixels P4 arranged in the pixel region 10, from the first photodiode PD1 and the second photodiode PD2 of each fourth pixel P4 covered with the B filter, a pair of pupil division signals B4A and B4B corresponding to light fluxes that have passed through pupil regions divided in the first direction D4 of the imaging lens unit 5 are output, respectively. The defocus amount in the fourth direction D4 can be obtained by performing the same correlation calculation using an A image composed by collecting the pupil division signals B4A and a B image composed by collecting the pupil division signals B4B. At this time, information on the reliability of the obtained defocus amount is also acquired.

Then, the overall control/arithmetic unit 2 obtains a driving amount of the focus lens based on the obtained six defocus amounts and the information on the reliability. Then, the lens drive unit 6 is controlled based on the obtained driving amount, and the lens drive unit 6 drives the imaging lens unit 5, thereby performing focus control.

The defocus amounts in the third direction D3 and the fourth direction D4 may be obtained for either the G filter or the B filter.

As described above, according to the first embodiment, it is possible to improve the accuracy of focus detection in the increased number of directions in which the brightness of subject changes.

<Modification>

When calculating the defocus amount, luminance signals may be generated from the pupil division signals obtained from the first to fourth pixels P1 to P4, and the generated luminance signals may be used for correlation calculation in the first to fourth directions D1 to D4. By doing so, it is possible to reduce the number of correlation calculations as compared with performing the correlation calculation in two directions for each of the R, G, and B signals as described above.

A conversion method for generating a luminance signal from the pupil division signals of the first to fourth pixels P1 to P4 will be described below. The following equations (1) to (4) are used for the generation of the luminance signals, and each conversion is performed by using the signals obtained from the first photodiodes PD1 of each of the first to fourth pixels P1 to P4 or the signals obtained from the second photodiodes PD2 of each of the first to fourth pixels P1 to P4. That is, in the equations (1) to (4), R1 corresponds to the pupil division signal R1A or R1B, and R2 corresponds to the pupil division signal R2A or R2B. Further, G3 corresponds to the pupil division signal G3A or G3B, G4 corresponds to the pupil division signal G4A or G4B, B3 corresponds to the pupil division signal B3A or B3B, and B4 corresponds to the pupil division signals B4A or B4B. (x, y) indicates the coordinates of the desired luminance signal.

$$Y1(x,y) = \alpha1 \times R1(x,y) + \beta1 \times G3(x,y) + \gamma1 \times B3(x,y) \quad (1)$$

$$Y2(x,y) = \alpha1 \times R2(x,y) + \beta1 \times G4(x,y) + \gamma1 \times B4(x,y) \quad (2)$$

$$Y3(x,y) = \alpha2 \times R1(x,y) + \beta2 \times G3(x,y) + \gamma2 \times B3(x,y) \quad (3)$$

$$Y4(x,y) = \alpha2 \times R2(x,y) + \beta2 \times G4(x,y) + \gamma2 \times B4(x,y) \quad (4)$$

Equation (1) is for obtaining a luminance signal $Y1(x, y)$ to be used as the pupil division signals corresponding to light fluxes that have passed through pupil regions divided in the first direction D1 of the imaging lens unit 5 at the coordinates (x, y). $R1(x, y)$ is multiplied by a coefficient $\alpha1$, $G3(x, y)$ is multiplied by a coefficient $\beta1$, and $B3(x, y)$ is multiplied by a coefficient $\gamma1$, and the products are added to obtain the luminance signal $Y1(x, y)$ at the coordinates (x, y). As described above, for each of the pupil division signals output from the photodiodes P1 and P2, the luminance signal $Y1(x, y)$ is calculated, and the luminance signals $Y1(x, y)$ are collected to generate the A image and the B image, respectively, and used for correlation calculation in the first direction D1. At this time, by setting the magnitude relation between the coefficients to $\alpha1 > \beta1$ and $\gamma1$, more weight is put on the pupil division signal R1 whose division direction of the pupil division signals is close to the direction of the correlation calculation when converting to the luminance signal.

In the image sensor in which the color filters are Bayer-arranged, either of R, G, and B signals will be obtained at the coordinates (x, y). Therefore, for other colors, virtual signals at the coordinates (x, y) may be generated using a known interpolation calculation using pixel signals of the other colors located near the coordinates (x, y).

Equation (2) is for obtaining a luminance signal $Y2(x, y)$ to be used as the pupil division signals corresponding to light fluxes that have passed through pupil regions divided in the second direction D2, orthogonal to the first direction D1, of the imaging lens unit 5 at the coordinates (x, y). In equation (2), the coefficients $\alpha1$, $\beta1$, $\gamma1$ common to equation (1) are used, and $R2(x, y)$ is multiplied by the coefficient $\alpha1$, $G4(x, y)$ is multiplied by the coefficient $\beta1$, and $B4(x, y)$ is multiplied by the coefficient $\gamma1$, and the products are added to obtain the luminance signal $Y2(x, y)$ at the coordinates (x, y). As described above, for each of the pupil division signals output from the photodiodes P1 and P2, the luminance signal $Y2(x, y)$ is calculated, and the luminance signals $Y2(x, y)$ are collected to generate the A image and the B image, respectively, and used for correlation calculation in the second direction D2.

Equation (3) is for obtaining a luminance signal $Y3(x, y)$ to be used as the pupil division signals corresponding to light fluxes that have passed through pupil regions divided in the third direction D3, which is different from the first direction D1 and the second direction D2, of the imaging lens unit 5 at the coordinates (x, y). In Equation (3), $R1(x, y)$ is multiplied by a coefficient $\alpha2$, $G3$ (x, y) is multiplied by a coefficient $\beta2$, and $B3$ $(x, y)$ is multiplied by a coefficient $\gamma2$, and the products are added to obtain the luminance signal $Y3(x, y)$ at the coordinates (x, y). At this time, by setting the magnitude relation between the coefficients to $\beta2$ and $\gamma2 > \alpha1$, more weight is put on the signal from the G pixel and B pixel whose division direction of the pupil division signals is close to the direction of the correlation calculation when converting to the luminance signal. Then, as described above, for each of the pupil division signals output from the photodiodes P1 and P2, the luminance signal $Y3(x, y)$ is calculated, and the luminance signals $Y3(x, y)$ are collected to generate the A image and the B image, respectively, and used for correlation calculation in the third direction D3. The magnitude relation between the coefficients of the equations (1) and (3) is $\alpha1 > \alpha2$, $\beta1 < \beta2$, and $\gamma1 < \gamma2$.

Equation (4) is for obtaining a luminance signal $Y4(x, y)$ to be used as the pupil division signals corresponding to light fluxes that have passed through pupil regions divided in the fourth direction D4, orthogonal to the third direction D3, of the imaging lens unit 5 at the coordinates (x, y). In equation (4), the coefficients $\alpha2$, $\beta2$, $\gamma2$ common to equation (3) are used, and $R2(x, y)$ is multiplied by the coefficient $\alpha2$, $G4$ (x, y) is multiplied by the coefficient $\beta2$, and $B4$ $(x, y)$ is multiplied by the coefficient $\gamma2$, and the products are added to obtain the luminance signal $Y4(x, y)$ at the coordinates (x, y). As described above, for each of the pupil division signals output from the photodiodes P1 and P2, the luminance signal $Y4(x, y)$ is calculated, and the luminance signals $Y4(x, y)$ are collected to generate the A image and the B image, respectively, and used for correlation calculation in the fourth direction D4.

In this way, the number of correlation calculations can be reduced by performing the correlation calculation after obtaining the pupil division luminance signals at each coordinate.

Second Embodiment

Next, a second embodiment of the present invention will be described. In the second embodiment, the image sensor 1 is configured, in addition to the plurality of first to fourth pixels P1 to P4 described with reference to FIGS. 2 to 4, with fifth pixels P5 and sixth pixels P6 having the same configuration of the first pixels P1 and the second pixels P2 except for being covered by W filters that transmit white light instead of the color filters 111 or not covered by any filter. That is, the division direction of the pupil division signals output from the fifth pixels P5 is equal to the division direction of the pupil division signals output from the first pixels P1, and the division direction of the pupil division signals output from the sixth pixels P6 is equal to the division direction of the pupil division signals output from the second pixels P2.

Therefore, from the fifth pixels P5, pupil division signals W1A and W1B divided in the first direction D1 which is different from the division direction of the sensitivity region can be obtained. Further, from the sixth pixels P6, pupil division signals W2A and W2B divided in the second direction D2 which is orthogonal to the first direction D1 can be acquired.

Thus, according to the second embodiment, in addition to the defocus amount obtained by using the pupil division signals of each color component, the defocus amount can be obtained by using the pupil division signals based on white light. By using the pupil division signals based on white light in this way, it is possible to perform more accurate focus detection when the brightness of a subject is low.

<Modification>

When the image sensor 1 has the configuration as shown in FIG. 6, when determining the defocus amount, luminance signals may be generated from the pupil division signals obtained from the first to sixth pixels P1 to P6, and correlation calculations in the first to fourth directions D1 to D4 may be performed using the generated luminance signals. By doing so, it is possible to reduce the number of correlation calculations as compared with performing the correlation calculations in two directions for each of the R, G, B, and W signals as described above.

A conversion method for generating luminance signals from the pupil division signals of the first to sixth pixels P1 to P6 will be described below. The following equations (5) to (8) are equations showing a conversion method for generating luminance signals. Equations (5) to (8) are different from equations (1) to (4) in that the pupil division signals from the fifth pixel P5 and the sixth pixel P6 are further used. In equations (5) to (8), W1 represents the pupil division signal W1A or W1B, and W2 represents the pupil division signal W2A or W2B.

$$Y1(x,y)=\alpha 1 \times R1(x,y)+\beta 1 \times G3(x,y)+\gamma 1 \times B3(x,y)+\delta 1 \times W1(x,y) \quad (5)$$

$$Y2(x,y)=\alpha 1 \times R2(x,y)+\beta 1 \times G4(x,y)+\gamma 1 \times B4(x,y)+\delta 1 \times W2(x,y) \quad (6)$$

$$Y3(x,y)=\alpha 2 \times R1(x,y)+\beta 2 \times G3(x,y)+\gamma 2 \times B3(x,y)+\delta 2 \times W1(x,y) \quad (7)$$

$$Y4(x,y)=\alpha 2 \times R2(x,y)+\beta 2 \times G4(x,y)+\gamma 2 \times B4(x,y)+\delta 2 \times W2(x,y) \quad (8)$$

Equation (5) is for obtaining a luminance signal $Y1(x, y)$ to be used as the pupil division signals divided in the first direction D1 at the coordinates (x, y). The value obtained by multiplying W1 by a coefficient S1 and adding the product to the above-mentioned equation (1) is defined as the luminance signal $Y1(x, y)$ at the coordinates (x, y). Then, for each of the pupil division signals output from the photodiodes P1 and P2, the luminance signal $Y1(x, y)$ is calculated, and the luminance signals $Y1(x, y)$ are collected to generate the A image and the B image, respectively, and used for correlation calculation in the first direction D1.

Equation (6) is for obtaining a luminance signal $Y2(x, y)$ to be used as the pupil division signals divided in the second direction D2 at the coordinates (x, y). The value obtained by multiplying W2 by the coefficient S1 and adding the product to the above-mentioned equation (2) is defined as the luminance signal $Y2(x, y)$ at the coordinates (x, y). Then, for each of the pupil division signals output from the photodiodes P1 and P2, the luminance signal $Y2(x, y)$ is calculated, and the luminance signals $Y2(x, y)$ are collected to generate the A image and the B image, respectively, and used for correlation calculation in the second direction D2.

Equation (7) is for obtaining a luminance signal $Y3(x, y)$ to be used as the pupil division signals divided in the third direction D3 at the coordinates (x, y). The value obtained by multiplying W1 by a coefficient 52 and adding the product to the above-mentioned equation (3) is defined as the luminance signal $Y3(x, y)$ at the coordinates (x, y). Then, for each of the pupil division signals output from the photodiodes P1 and P2, the luminance signal $Y3(x, y)$ is calculated, and the luminance signals $Y4(x, y)$ are collected to generate the A image and the B image, respectively, and used for correlation calculation in the third direction D3.

Equation (8) is for obtaining a luminance signal $Y4(x, y)$ to be used as the pupil division signals divided in the fourth direction D4 at the coordinates (x, y). The value obtained by multiplying W2 by the coefficient 52 and adding the product to the above-mentioned equation (4) is defined as the luminance signal $Y4(x, y)$ at the coordinates (x, y). Then, for each of the pupil division signals output from the photodiodes P1 and P2, the luminance signal $Y4(x, y)$ is calculated, and the luminance signals $Y4(x, y)$ are collected to generate the A image and the B image, respectively, and used for correlation calculation in the fourth direction D4.

At this time, similarly to the first embodiment, more weight is put on the signals whose division direction of the pupil division signals is close to the direction of the correlation calculation when converting to the luminance signal. Since the W filter transmits light in all transmission wavelength bands of the R, G, and B filters, in this modification, the magnitude relationship between the weighting coefficients is determined as $\alpha 1 > \delta 1 > \beta 1$ and $\gamma 1$, $\alpha 2 < \delta 2 < \beta 2$ and $\gamma 2$, and $\delta 1 > \delta 2$.

The magnitude relationship between the weighting coefficients by which the pupil division signals of other colors are multiplied is the same as that of the modification of the first embodiment.

In this way, the number of correlation calculations can be reduced by performing the correlation calculation after obtaining the pupil division luminance signals at each coordinate.

Note that in the first and second embodiments described above, as shown in FIGS. 3A to 3F and FIGS. 4A to 4F, the case where each sensitivity region is rectangular has been described, but the present invention is not limited to this. If the shape of each sensitivity region is the same, for example, it may be a triangle, and the same effect can be obtained.

OTHER EMBODIMENTS

The present invention may be applied to a system composed of a plurality of devices or an apparatus composed of one device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-107231, filed on Jun. 22, 2020 which is hereby incorporated by reference herein in its entirety.

What is claimed is:

1. An image sensor comprising:
a plurality of microlenses; and
a pixel region including, with respect to each of the plurality of microlenses,
a plurality of first sensitivity regions formed at first depth from a light incident surface,
a plurality of second sensitivity regions formed at second depth which is deeper than the first depth, and
a plurality of connection portions that electrically connect the plurality of first regions and the plurality of second regions in different combinations.

2. The image sensor according to claim 1, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other.

3. The image sensor according to claim 2, wherein, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure.

4. The image sensor according to claim 3, wherein the first and second structures are covered with color filters of a first color, and the third and fourth structures are covered with color filters of a color different from the first color.

5. The image sensor according to claim 4, wherein the third and fourth structures are covered with either color filters of a second color or color filters of a third color.

6. The image sensor according to claim 5, wherein the first to fourth structures are arranged so that the color filters are in Bayer arrangement.

7. The image sensor according to claim 6, wherein, at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter.

8. An image capturing apparatus comprising:
an image sensor comprising:
a plurality of microlenses; and
a pixel region including, with respect to each of the plurality of microlenses,
a plurality of first sensitivity regions formed at first depth from a light incident surface,
a plurality of second sensitivity regions formed at second depth which is deeper than the first depth, and
a plurality of connection portions that electrically connect the plurality of first regions and the plurality of second regions in different combinations, and
a focus detection unit that obtains pupil division signals corresponding to light fluxes passing through different pupil regions, respectively, from signals output from the pixel region and performs phase difference focus detection for each of structures formed by connecting the plurality of first regions and the plurality of second regions by the plurality of connection portions in the different combinations based on the pupil division signals,
wherein the focus detection unit is implemented by one or more processors, circuitry or a combination thereof.

9. An image capturing apparatus comprising:
an image sensor comprising:
a plurality of microlenses; and
a pixel region including, with respect to each of the plurality of microlenses,
a plurality of first sensitivity regions formed at first depth from a light incident surface,
a plurality of second sensitivity regions formed at second depth which is deeper than the first depth, and
a plurality of connection portions that electrically connect the plurality of first regions and the plurality of second regions in different combinations, and
a focus detection unit that obtains pupil division signals which divide pupil region from signals output from the pixel region and performs phase difference focus detection based on the pupil division signals,
wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement,
wherein the focus detection unit generates luminance signals which divide pupil regions based on the pupil division signals obtained from the first to fourth structures, and performs the phase difference focus detection based on the luminance signals, and
wherein the focus detection unit is implemented by one or more processors, circuitry or a combination thereof.

10. The image capturing apparatus according to claim 9, wherein the focus detection unit generates the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, and adding products;

generates the luminance signals corresponding to light fluxes passing through pupil regions divided in first direction by using the pupil division signals obtained from the first structures and setting the first coefficient larger than the second and third coefficients;

generates the luminance signals corresponding to light fluxes passing through pupil regions divided in second direction by using the pupil division signals obtained from the second structures and setting the first coefficient larger than the second and third coefficients;

generates the luminance signals corresponding to light fluxes passing through pupil regions divided in third direction by using the pupil division signals obtained from the first structures and setting the first coefficient smaller than the second and third coefficients; and generates the luminance signals corresponding to light fluxes passing through pupil regions divided in fourth direction by using the pupil division signals obtained from the second structures and setting the first coefficient smaller than the second and third coefficients, wherein the first to fourth directions are different from each other.

11. An image capturing apparatus comprising:
an image sensor comprising:
  a plurality of microlenses; and
  a pixel region including, with respect to each of the plurality of microlenses,
    a plurality of first sensitivity regions formed at first depth from a light incident surface,
    a plurality of second sensitivity regions formed at second depth which is deeper than the first depth, and
    a plurality of connection portions that electrically connect the plurality of first regions and the plurality of second regions in different combinations, and
a focus detection unit that obtains pupil division signals which divide pupil region from signals output from the pixel region and performs phase difference focus detection based on the pupil division signals,
wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, wherein the focus detection unit generates luminance signals whose pupils are divided based on the pupil division signals obtained from the first to sixth structures, and performs the phase difference focus detection based on the luminance signals, and wherein the focus detection unit is implemented by one or more processors, circuitry or a combination thereof.

12. The image capturing apparatus according to claim 11, wherein the focus detection unit generates the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, multiplying the pupil division signals obtained from the fifth and sixth structures by a fourth coefficient, and adding products;

generates the luminance signals corresponding to light fluxes passing through pupil regions divided in first direction by using the pupil division signals obtained from the first structures and setting the fourth coefficient smaller than the first coefficient and larger than the second and third coefficients;

generates the luminance signals corresponding to light fluxes passing through pupil regions divided in second direction by using the pupil division signals obtained from the second structures and setting the fourth coefficient smaller than the first coefficient and larger than the second and third coefficients;

generates the luminance signals corresponding to light fluxes passing through pupil regions divided in third direction by using the pupil division signals obtained from the first structures and setting the fourth coefficient larger than the first coefficient and the first coefficient smaller than the second and third coefficients; and generates the luminance signals corresponding to light fluxes passing through pupil regions divided in fourth direction by using the pupil division signals obtained from the second structures and setting the fourth coefficient larger than the first coefficient and the first coefficient smaller than the second and third coefficients, wherein the first to fourth directions are different from each other.

13. A method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement, the method comprising:

generating luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, and adding products, and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the first coefficient larger than the second and third coefficients, the luminance signals corresponding to light fluxes passing through pupil regions divided in second direction are generated by using the pupil division signals obtained from the second structures and setting the first coefficient larger than the second and third coefficients, the luminance signals corresponding to light fluxes passing through pupil regions divided in third direction are generated by using the pupil division signals obtained from the first structures and setting the first coefficient smaller than the second and third coefficients, the luminance signals corresponding to light fluxes passing through pupil regions divided in fourth direction are generated by using the pupil division signals obtained from the second structures and setting the first coefficient smaller than the second and third coefficients, wherein the focus detection is performed for each of the first to fourth directions, and wherein the first to fourth directions are different from each other.

14. A method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, the method comprising:

generating the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, multiplying the pupil division signals obtained from the fifth and sixth structures by a fourth coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the fourth coefficient smaller than the first coefficient and larger than the second and third coefficients, the luminance signals corresponding to light fluxes passing through pupil regions divided in second direction are generated by using the pupil division signals obtained from the second structures and setting the fourth coefficient smaller than the first coefficient and larger than the second and third coefficients, the luminance signals corresponding to light fluxes passing through pupil regions divided in third direction are generated by using the pupil division signals obtained from the first structures and setting the fourth coefficient larger than the first coefficient and the first coefficient smaller than the second and third coefficients, the luminance signals corresponding to light fluxes passing through pupil regions divided in fourth direction are generated by using the pupil division signals obtained from the second structures and setting the fourth coefficient larger than the first coefficient and the first coefficient smaller than the second and third coefficients, wherein the focus detection is performed for each of the first to fourth directions, and wherein the first to fourth directions are different from each other.

15. A non-transitory computer-readable storage medium, the storage medium storing a program that is executable by the computer, wherein the program includes program code for causing the computer to function as a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, and at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and the first to fourth structures being arranged so that the color filters are in Bayer arrangement, the method comprising:

generating luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the first coefficient larger than the second and third coefficients, the luminance signals corresponding to light fluxes passing through pupil regions divided in second direction are generated by using the pupil division signals obtained from the second structures and setting the first coefficient larger than the second and third coefficients, the luminance signals corresponding to light fluxes passing through pupil regions divided in third direction are generated by using the pupil division signals obtained from the first structures and setting the first coefficient smaller than the second and third coefficients, the luminance signals corresponding to light fluxes passing through pupil regions divided in fourth direction are generated by using the pupil division signals obtained from the second structures and setting the first coefficient smaller than the second and third coefficients, wherein the focus detection is performed for each of the first to fourth directions, and wherein the first to fourth directions are different from each other.

16. A non-transitory computer-readable storage medium, the storage medium storing a program that is executable by the computer, wherein the program includes program code for causing the computer to function as a method of performing phase difference focus detection by obtaining and using pupil division signals corresponding to light fluxes passing through different pupil regions from signals output from an image sensor that comprises a plurality of microlenses and a pixel region including, with respect to each of the plurality of microlenses, a plurality of first sensitivity regions formed at first depth from a light incident surface, a plurality of second sensitivity regions formed at second depth which is deeper than the first depth, and a plurality of connection portions that electrically connect the plurality of first regions and the plurality of second regions in different combinations, wherein, at least for a part of the plurality of microlenses, the plurality of first regions and the plurality of second regions are connected by the plurality of connection portions to form either a first structure or a second structure, the first structure and the second structure dividing a pupil region in directions orthogonal to each other and being covered with color filters of a first color, at least for another part of the plurality of microlenses, the plurality of first regions and the plurality of second regions are connected by the plurality of connection portions to form either a third structure or a fourth structure, the third structure and the fourth structure dividing the pupil region in directions orthogonal to each other and in different directions from the first structure and the second structure and being covered with color filters of either a second color or a third color, and at least for another part of the plurality of microlenses, the plurality of first regions and the plurality of second regions are connected by the plurality of connection portions to form either fifth structure or a sixth structure, the fifth structure being the same as the first structure except for not being covered with a color filter, and the sixth structure being the same as the second structure except for not being covered with a color filter, the method comprising:

generating the luminance signals by multiplying the pupil division signals obtained from the first or second structure by a first coefficient, multiplying, among the pupil division signals obtained from the third or fourth structure, the pupil division signals corresponding to the color filter of the second color by a second coefficient, multiplying, among the pupil division signals obtained from the third or fourth structure, the pupil division signals corresponding to the color filter of the third color by a third coefficient, multiplying the pupil division signals obtained from the fifth and sixth structures by a fourth coefficient, and adding products; and performing the phase difference focus detection based on the luminance signals, wherein, upon generating the luminance signals, the luminance signals corresponding to light fluxes passing through pupil regions divided in first direction are generated by using the pupil division signals obtained from the first structures and setting the fourth coefficient smaller than the first coefficient and larger than the second and third coefficients, the luminance signals corresponding to light fluxes passing through pupil regions divided in second direction are generated by using the pupil division signals obtained from the second structures and setting the fourth coefficient smaller than the first coefficient and larger than the second and third coefficients, the luminance signals corresponding to light fluxes passing through pupil regions divided in third direction are generated by using the pupil division signals obtained from the first structures and setting the fourth coefficient larger than the first coefficient and the first coefficient smaller than the second and third coefficients, the luminance signals corresponding to light fluxes passing through pupil regions divided in fourth direction are generated by using the pupil division signals obtained from the second structures and setting the fourth coefficient larger than the first coefficient and the first coefficient smaller than the second and third coefficients, wherein the focus detection is performed for each of the first to fourth directions, and wherein the first to fourth directions are different from each other.

* * * * *